US010217682B2

(12) United States Patent
Davis et al.

(10) Patent No.: US 10,217,682 B2
(45) Date of Patent: Feb. 26, 2019

(54) TIME TEMPERATURE MONITORING SYSTEM

(71) Applicant: International Business Machines Corporation, Armonk, NY (US)

(72) Inventors: Taryn J. Davis, Beacon, NY (US); Jonathan R. Fry, Wappingers Falls, NY (US); Terence L. Kane, Wappingers Falls, NY (US); Christopher F. Klabes, Poughkeepsie, NY (US); Andrew J. Martin, Carmel, NY (US); Vincent J. McGahay, Poughkeepsie, NY (US); Kathryn E. Schlichting, Bloomington, MN (US); Melissa A. Smith, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/949,225

(22) Filed: Apr. 10, 2018

(65) Prior Publication Data

US 2018/0226308 A1     Aug. 9, 2018

Related U.S. Application Data

(62) Division of application No. 14/741,086, filed on Jun. 16, 2015, now Pat. No. 10,032,683.

(51) Int. Cl.
*G01K 3/10* (2006.01)
*G01K 3/04* (2006.01)
(Continued)

(52) U.S. Cl.
CPC ................ *H01L 22/34* (2013.01); *G01K 3/04* (2013.01); *H01L 22/14* (2013.01); *H01L 22/26* (2013.01)

(58) Field of Classification Search
CPC ......... H01L 22/34; H01L 22/14; H01L 22/26; G01K 3/04; G01K 7/01; G01K 13/00;
(Continued)

(56) References Cited

U.S. PATENT DOCUMENTS 4,263,057 A * 4/1981 Ipri ....................... H01L 21/033
438/151
4,382,700 A    5/1983 Youngren
(Continued)

FOREIGN PATENT DOCUMENTS

EP     1645856 A1    4/2006
JP     S58100472 A   6/1983
(Continued)

OTHER PUBLICATIONS

Non Final Office Action dated Oct. 25, 2017 for U.S. Appl. 14/741,086, filed Jun. 16, 2015; pp. 17.
(Continued)

*Primary Examiner* — Gail Kaplan Verbitsky
(74) *Attorney, Agent, or Firm* — Steven J. Meyers; Hoffman Warnick LLC

(57) ABSTRACT

A time temperature monitoring system and method for use with a microchip or similar structure. A disclosed system includes: a substrate having an active region; a dopant source located proximate the active region; an activation system for activating a diffusion of the dopant source into the active region; and a set of spatially distributed electrodes embedded in the active region of the substrate, wherein the electrodes are configured to detect the diffusion in the active region at varying distances from the dopant source to provide time temperature information.

19 Claims, 5 Drawing Sheets

(51) Int. Cl.
*G01K 7/01* (2006.01)
*H01L 21/66* (2006.01)

(58) Field of Classification Search
CPC . G01K 11/12; G01K 1/12; G01K 3/10; G01N 25/00; G01N 25/30
USPC .................. 374/100–106, 178, 108, 137, 44; 116/216
See application file for complete search history.

(56) References Cited

U.S. PATENT DOCUMENTS

| | | | |
|---|---|---|---|
| 4,432,656 A | 2/1984 | Allmendinger | |
| 5,622,659 A * | 4/1997 | Spicuzza | C01D 15/04 264/1.22 |
| 5,975,758 A * | 11/1999 | Yokota | G01K 7/183 338/25 |
| 6,303,906 B1 * | 10/2001 | Yoo | H01L 21/67109 118/50.1 |
| 6,514,462 B1 | 2/2003 | Simons | |
| 6,974,249 B1 | 12/2005 | Fair et al. | |
| 7,993,698 B2 * | 8/2011 | Blake | H01J 37/3171 427/523 |
| 8,047,706 B2 | 11/2011 | Goodman et al. | |
| 8,177,423 B1 | 5/2012 | Fair et al. | |
| 8,746,969 B2 * | 6/2014 | Feist | C09D 7/62 374/102 |
| 8,824,246 B2 | 9/2014 | Braunberger | |
| 9,157,809 B2 * | 10/2015 | Furue | G01K 11/12 |
| 9,976,913 B2 * | 5/2018 | Caraveo Frescas | H01L 29/24 |
| 10,032,683 B2 * | 7/2018 | Davis | H01L 22/34 |
| 2008/0079085 A1 * | 4/2008 | Schwan | H01L 21/76229 257/369 |
| 2008/0187021 A1 | 8/2008 | Haarer et al. | |
| 2008/0217703 A1 * | 9/2008 | Mehta | H01L 21/76224 257/397 |
| 2010/0296545 A1 | 10/2010 | Haarer et al. | |
| 2011/0069735 A1 | 3/2011 | Feist et al. | |
| 2011/0155043 A1 | 6/2011 | Haarer et al. | |
| 2014/0203366 A1 * | 7/2014 | Schulz | H01L 21/823821 257/351 |
| 2015/0146761 A1 * | 5/2015 | Caraveo Frescas | H01L 29/24 374/178 |
| 2015/0303200 A1 * | 10/2015 | Yuki | H01L 27/10852 257/296 |
| 2016/0372391 A1 | 12/2016 | Davis et al. | |
| 2017/0299650 A1 * | 10/2017 | Coyne | G01R 31/2879 |

FOREIGN PATENT DOCUMENTS

| | | |
|---|---|---|
| JP | 2012145459 A | 8/2012 |
| WO | 2014064755 A1 | 5/2014 |

OTHER PUBLICATIONS

Notice of Allowance and Fee(s) Due dated Mar. 26, 2018 for U.S. Appl. No. 14/741,086, filed Jun. 16, 2015; pp. 19.

* cited by examiner

| Device under Normal Operation 85C | 1month | 1year | 5years | 10years |
|---|---|---|---|---|
| Distance Diffused | 267nm | 1000nm | 2000nm | 3000nm |
| FET1 | Fail | Fail | Fail | Fail |
| FET2 | Works | Fail | Fail | Fail |
| FET3 | Works | Works | Fail | Fail |
| FET4 | Works | Works | Works | Fail |

FIGURE 5

|  | 1month Elevated | 1 month Normal |
|---|---|---|
| Distance Diffused | 1652nm | 267nm |
| FET1 | Fail | Fail |
| FET2 | Fail | Works |
| FET3 | Works | Works |
| FET4 | Works | Works |

FIGURE 6

TIME TEMPERATURE MONITORING SYSTEM

BACKGROUND

The disclosure relates generally to time temperature monitoring of a microchip or package. More specifically, embodiments of the present disclosure include a system and method that measures the diffusion of a dopant to determine the time temperature history of a microchip or package.

In general, time temperature indicators provide a summary of the exposure history of a product to time and temperature. In products that are sensitive to time and temperature, a time temperature indicator may for example indicate the remaining shelf-life of a product, or the rate at which the product is deteriorating.

Although most prominently used with perishable food items, time temperature indicators have potential applications with any device that is subject to high temperatures that could negatively impact performance of the device. For example, devices such as microchips are potentially subject to failures when operating outside temperature specifications for prolonged periods of time. Unfortunately, implementing time temperature indicators for use with microchips tend to involve complex solutions that limit their efficacy.

BRIEF SUMMARY

A first aspect of the disclosure provides a time temperature monitoring system, comprising: a substrate having an active region; a dopant source located proximate the active region; an activation system for activating a diffusion of the dopant source into the active region; and a set of spatially distributed electrodes embedded in the active region of the substrate, wherein the electrodes are configured to detect the diffusion in the active region at varying distances from the dopant source to provide time temperature information.

A second aspect of the disclosure provides a method for generating time temperature information with a substrate having an active region, a dopant source located proximate the active region, and a set of spatially distributed electrodes embedded in the active region of the substrate, the method comprising: periodically detecting a diffusion in the active region at varying distances from the dopant source; and analyzing the diffusion to provide time temperature information.

A third aspect of the disclosure provides a microchip having an integrated time temperature monitoring system, comprising: a substrate having an active region; a dopant source located proximate the active region; an activation system for activating a diffusion of the dopant source into the active region; a set of spatially distributed electrodes embedded in the active region of the substrate, wherein the electrodes are configured to detect the diffusion in the active region at varying distances from the dopant source; and an interrogation system that periodically monitors the electrodes.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 5 shows illustrative time temperature information according to embodiments of the present disclosure.

FIG. 6 shows illustrative time temperature according to embodiments of the present disclosure.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Embodiments of the present disclosure provide a time temperature monitoring system that is integrated with a device such as a microchip to provide localized time temperature information. Aspects of the time temperature monitoring system may be fabricated directly on a device or on a dummy package that can be adhered to a device. Accordingly, for the purposes of this disclosure, the term "device" refers to any package that can incorporate micro-electronic features and an active dopant region. The time temperature information may be used for any purpose including, e.g., to provide real-time data for system diagnosis of a device, to evaluate packaging processes, to establish reliability standards, etc.

In general, time temperature history is captured by periodically monitoring changes in the resistance of a highly doped resistive ("active") region. More particularly, a structure is provided to track resistivity changes that occur due to diffusion of a dopant source, such as copper, through an active region of a silicon substrate, which is time and temperature dependent. As the dopant source diffuses through the active region, resistivity of the active region breaks down, which is monitored and analyzed to provide time temperature information.

The structure incorporates a set of spatially distributed electrodes that can be periodically monitored to detect a distance that the diffusion has traveled. In the examples that follow, an array of field effect transistors (FETs) is utilized to provide electrodes that can sense resistivity breakdown beyond a predetermined contamination limit in a substrate in which the FET is imbedded. Namely, resistivity breakdown will result in a detectable short circuit between selected ones of the FET's gate, source and drain nodes. It is recognized that other electrical structures (e.g., a fuse) for sensing resistivity, or lack thereof, could likewise be utilized.

Figure 1:
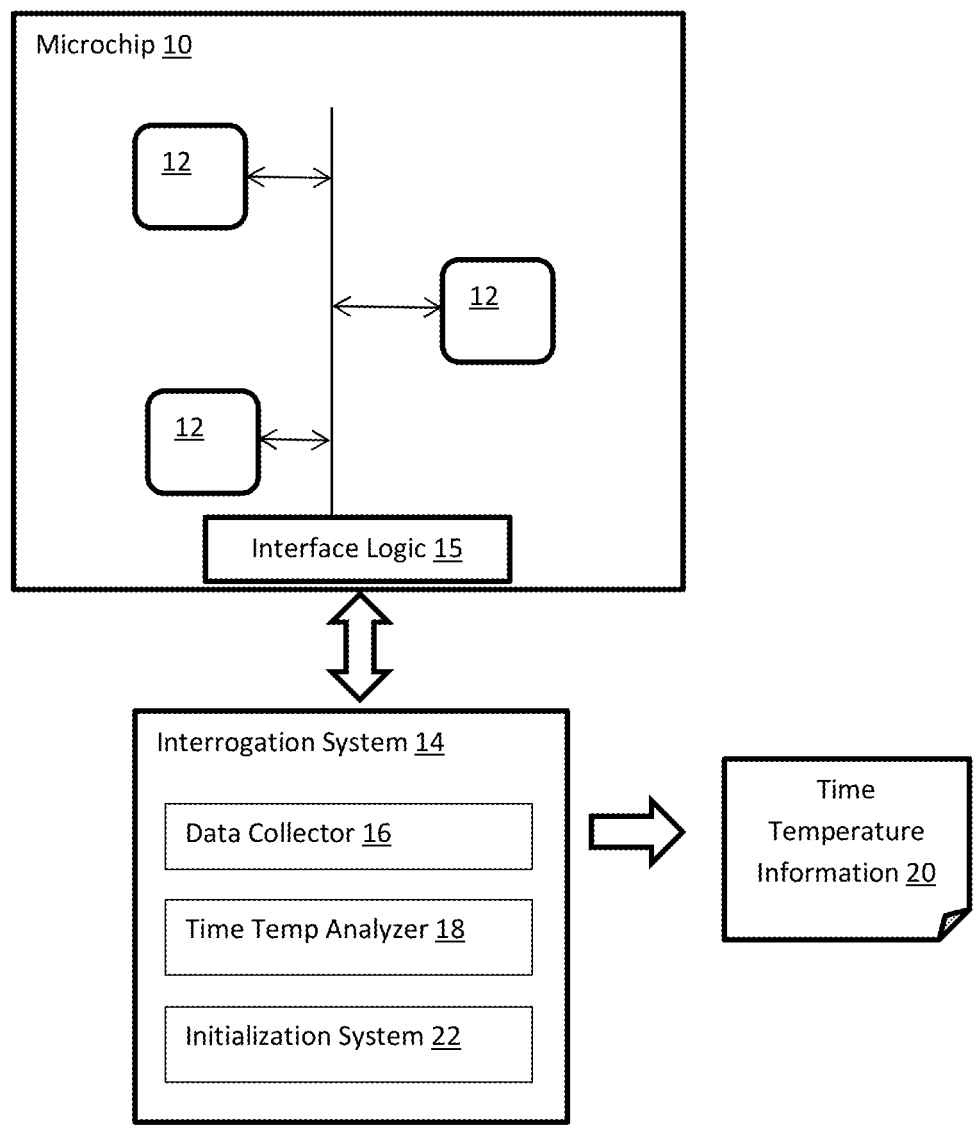
FIG. 1 shows a schematic of a microchip having a time-temperature monitoring system according to embodiments of the present disclosure.

FIG. 1 depicts a generalized schematic of a microchip 10 that incorporates a time temperature monitoring system. In this example, a set of localized sensors 12 are placed throughout the microchip 10. Each sensor 12 includes an array of FETs that are probed periodically via an interrogation system 14 to collect, analyze and output time temperature information 20. As described in more detail herein, FETs within each sensor 12 are strategically designed to fail in response to known time and temperature exposure profiles. Interface logic 15 includes the necessary circuitry and logic to allow interrogation system 14 to interface with each sensor 12.

In this embodiment, interrogation system 14 includes a data collector 16 to periodically check to see which FETs within each sensor 12 remain operational, and which FETs are inoperable. Based on the collected data, a time temperature analyzer 18 will determine and output time temperature information 20 for each sensor 12. Also included in interrogation system 14 is an initialization system 22 that triggers the interrogation process to begin. Depending on the application, interrogation system 14 may be integrated into the microchip 10, be externally implemented, or be implemented as a combination of internal and external components.

Figure 2:
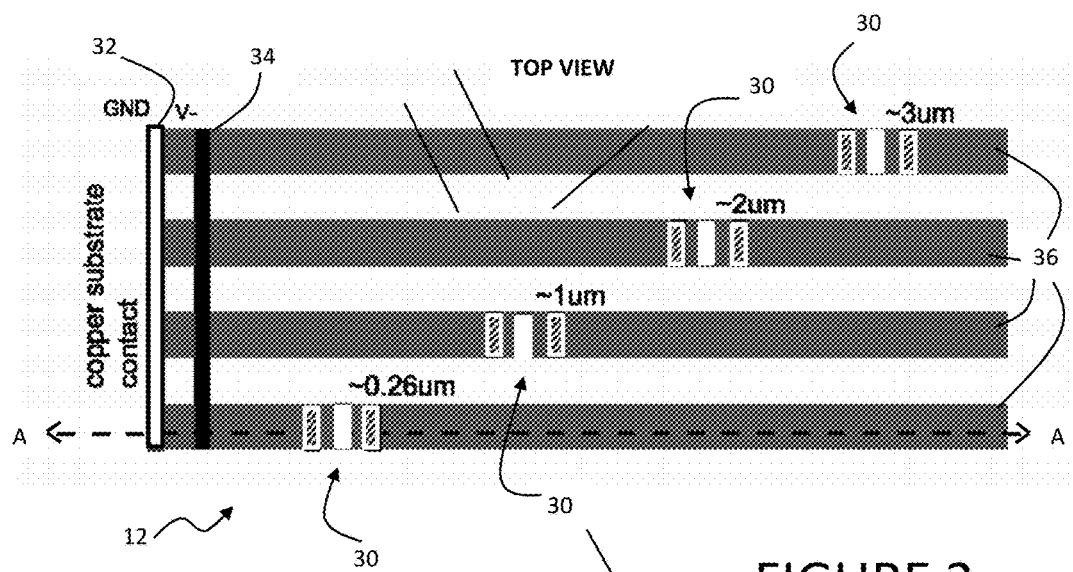
FIG. 2 shows a top schematic view of a sensor comprising a FET array according to embodiments of the present disclosure.
Figure 3:
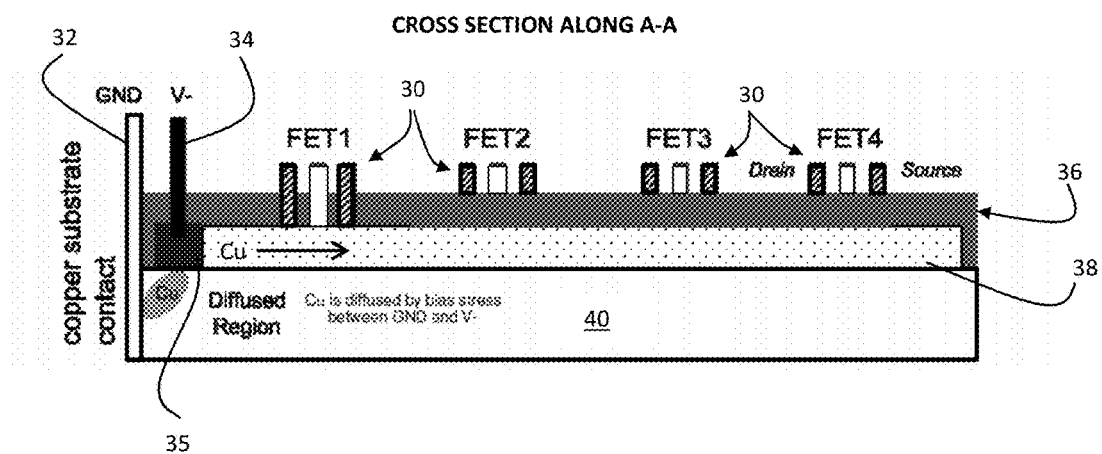
FIG. 3 shows a cross-sectional view of the FET array of FIG. 2 according to embodiments of the present disclosure.

FIGS. 2 and 3 depict a top view and a cross-sectional view, respectively, of an illustrative sensor 12. As shown in FIG. 2, each FET in an array of FETs 30 are placed at predetermined distances from a copper substrate contact 32, or ground terminal, which acts a dopant source. Each FET 30 resides within a nitride spacer 36 and sits on top of active layer 38, as shown in FIG. 3. A silicon based substrate 40 (e.g., SiCoH) resides below the active layer 38. An activation system for the sensor 12 is provided with an application of current between copper substrate contact 32 and V-terminal 34. Once activated, the copper (Cu) will begin to diffuse away from the copper substrate contact 32. The rate of diffusion will depend on time and temperature, and as the copper diffuses, FETs 30 will be short circuited ("shorted") rendering them inoperable. Accordingly, FET1 will be the first FET to fail at some point after copper is diffused into the channel of the FET1 device, followed by FET2 and so on.

Accordingly, by strategically placing FETs 30 at known distances away from the dopant source, a time temperature history of the sensor 12 and surrounding circuits can be assessed by probing electrical readouts of the FETs 30. Sensors 12 may be fabricated with standard FEOL (front end of the line) processes, thus incurring no additional costs. A copper BEOL (back end of the line) contact can be placed near each sensor 12, with no additional cost. The interrogation process is initialized by bias-stressing the copper into the silicon contact 35. This initialization can be done at any time, e.g., at chip burn-in, or at a later time. Although this embodiment uses copper, any controllable diffusive source may be utilized, e.g., aluminum, chromium, gallium, etc.

Once initialized, each sensor 12 is periodically tested to see which FETs 30 have failed, i.e., are shorted. As noted, a short would indicate that the copper has diffused into the channel of the device. Because the diffusion process is known to depend on time and temperature, time temperature information can be ascertained based on the location of the different FETs, and which FETs have failed.

Figure 4:
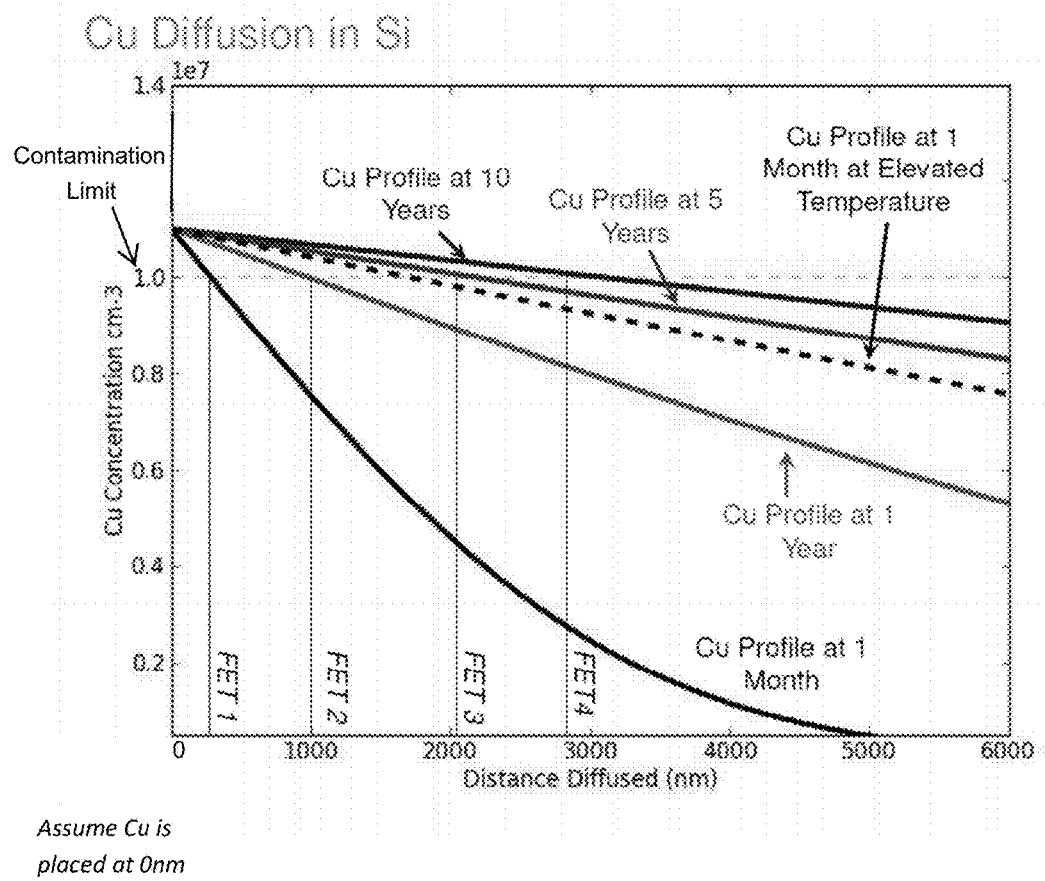
FIG. 4 shows a graph of copper diffusion profiles in silicon according to embodiments of the present disclosure.

Diffusion rates in silicon have been studied and behave in predictable manners. For example, FIG. 4 shows a graph of copper diffusion in silicon for the FETs 30 shown in FIGS. 2 and 3, based on diffused distance. Each solid line curve in the graph depicts a copper diffusion profile for a given time. For instance, it can be seen that, based on a Cu profile at one month 41, the location of FET1 will be at the contamination limit and therefore likely fail; based on the Cu profile at one year 42, the locations of FET1 and FET2 will be at or above the contamination limit and likely fail; based on the Cu profile at five years 44, the locations of FET1, FET2, and FET3 will be at or above the contamination limit and likely fail; and based on the Cu profile at 10 years 46, the locations of FET1, FET2, FET3 and FET4 will be at or above the contamination limit and likely fail.

Also shown as a dashed line is the Cu profile at one month at an elevated temperature 48 (i.e., above a predefined operating temperature threshold). In this case, with the elevated temperature, FET1 and FET2 will be at or above the contamination limit and likely fail. Similar elevated temperature curves for the other time periods, although not shown, can likewise be ascertained. Furthermore, although only a single elevated temperature curve is shown at one month, different curves could be utilized based on an amount or range of the elevated temperature for each time period. For instance, a first set of curves could be utilized for an elevated temperature at a range of 10-30 degrees Celsius, and a second set of curves could be utilized for an elevated temperature at a range of 31-60 degrees Celsius, and so on. Regardless, the time temperature analyzer 18 (FIG. 1) is implemented to take advantage of these known diffusion rate behaviors.

FIG. 5 depicts illustrative expected time temperature information based on a readout of the sensor 12 operating under normal conditions. Namely, as shown, FET1 is expected to fail at one month, FET2 is expected to fail at one year, etc. FIG. 6 depicts an illustrative expected read out at one month under both normal and elevated temperatures. As shown, FET2 is expected to fail at one month under elevated temperatures. Accordingly, by probing the FETs periodically, and comparing the results to expected results, time temperature information can be readily determined to indicate whether a chip, or an area on a chip, has experienced elevated temperatures over a period of time.

Figure 7:
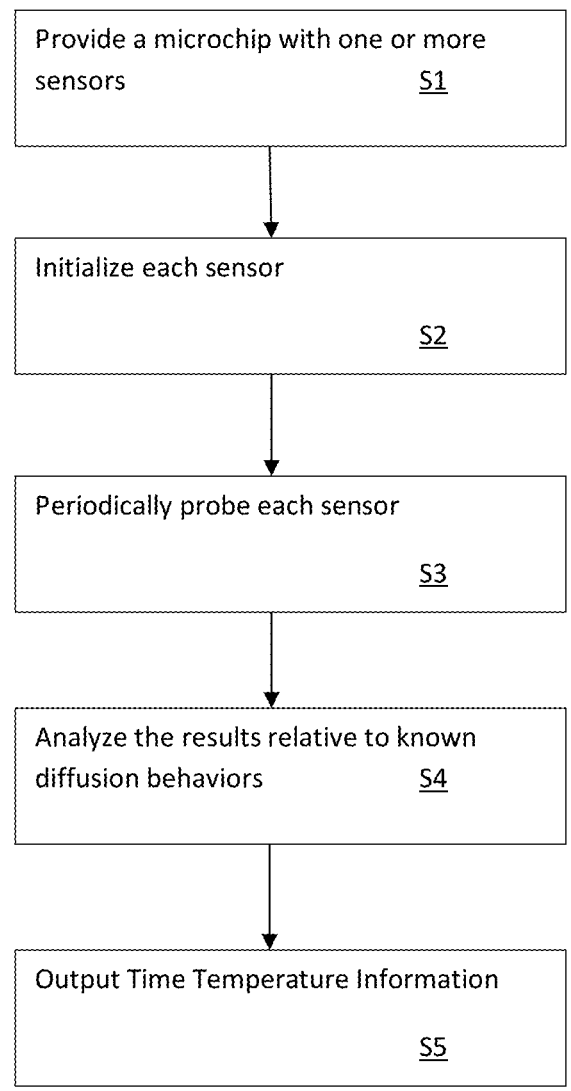
FIG. 7 shows a flow diagram of a method for collecting time temperature information.

FIG. 7 depicts a flow diagram of the process. At S1, a microchip is provided with one or more sensors 12 (as shown in FIGS. 1-3). At S2, each sensor 12 is initialized to enable the migration/injection of the copper from a dopant source into an active silicon region. Initialization is for example done by placing a current between the copper substrate contact 32 and V-terminal 34 shown in FIG. 1. Next, at S3, each sensor 12 is periodically probed to determine which FETs are operational and which have failed. At S4, the probing results are analyzed relative to known or expected diffusion behaviors to provide time temperature information, and at S5, the time temperature information is outputted.

The time temperature monitoring system described herein may be employed for any number of purposes. For example, such a system could be employed to gauge wafer finishing and module building in which thermal processes can vary, thus detecting potential reliability issues. In other cases, such a system could be used to monitor an application environment, e.g., to determine whether a device has been operated inside or outside temperature specs. Along the same lines, the actual "stress age" of devices in the field can be calculated in order to schedule service calls. In cases where a device has been overly stressed, the device may for example be set to a "limp-along" mode in which clocks are slowed using standard techniques to allow continued operation. Such as system could also be used for calibration purposes, e.g., to calibrate or correlate on chip thermal sensors and digital thermal sensor structures by comparing such sensors to the time temperature information generated by the present system.

Further features include the fact that such a system does not require the use of log files or processing elements on the package die to function. It is also noted that the distal range of diffusion is generally immobile in SiO2, i.e., it is limited to about 220 nm, under extremely accelerated thermal aging. Accordingly, the described process will not impact any surrounding circuitry on a chip.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A time temperature monitoring system, comprising:
a substrate having an active region;
a dopant source located proximate the active region;
an activation system for activating a diffusion of the dopant source into the active region; and
a set of spatially distributed transistors embedded in the active region of the substrate, wherein the transistors are configured to detect the diffusion correlated to time and temperature in the active region at varying distances from the dopant source to provide time temperature information.

2. The time temperature monitoring system of claim 1, wherein the dopant source comprises copper.

3. The time temperature monitoring system of claim 1, wherein the activation system includes circuitry for applying an electrical current between the dopant source and active region.

4. The time temperature monitoring system of claim 1, wherein the set of spatially distributed transistors comprise an array of field effect transistors (FETs) located at varying distances from the dopant source.

5. The time temperature monitoring system of claim 4, wherein a resistivity breakdown in the active region proximate a FET creates a short circuit condition within the FET rendering the FET inoperable.

6. The time temperature monitoring system of claim 5, further comprising a monitoring system that periodically monitors the array of FETs to ascertain which FETs are operable and which FETS are inoperable.

7. The time temperature monitoring system of claim 6, further comprising an analysis system that generates time temperature information based on which FETs are operable and which FETS are inoperable.

8. A monitoring system for generating time temperature information, the monitoring system configured to:
activate a diffusion of a dopant source into an active region of a substrate, the dopant source located proximate the active region; and
detect, using a set of spatially distributed transistors embedded in the active region of the substrate, the diffusion correlated to time and temperature in the active region at varying distances from the dopant source to provide time temperature information.

9. The monitoring system of claim 8, wherein the dopant source comprises copper.

10. The monitoring system of claim 8, wherein the activating includes applying an electrical current between the dopant source and the active region.

11. The monitoring system of claim 8, wherein the set of spatially distributed transistors comprise an array of field effect transistors (FETs) located at varying distances from the dopant source.

12. The monitoring system of claim 11, further configured to periodically monitor the array of FETs to ascertain which FETs are operable and which FETS are inoperable.

13. The monitoring system of claim 12, further configured to generate time temperature information based on which FETs are operable and which FETS are inoperable.

14. The monitoring system of claim 12, wherein an inoperable FET reflects a resistivity breakdown in the active region proximate the inoperable FET indicating that the dopant source has diffused beyond a contamination level.

15. A time temperature monitoring system, comprising:
a substrate having an active region;
a dopant source located proximate the active region;
an activation system for activating a diffusion of the dopant source into the active region; and
a set of spatially distributed electrodes embedded in the active region of the substrate, wherein the electrodes are configured to measure the diffusion correlated to time and temperature in the active region at varying distances from the dopant source to provide time temperature information, and wherein the set of spatially distributed electrodes comprise an array of field effect transistors (FETs) located at varying distances from the dopant source.

16. The time temperature monitoring system of claim 15, further comprising an interrogation system that periodically monitors the electrodes.

17. The time temperature monitoring system of claim 15, wherein the activating includes applying an electrical current between the dopant source and the active region.

18. The time temperature monitoring system of claim 15, wherein a resistivity breakdown in the active region proximate a FET creates a short circuit condition within the FET rendering the FET inoperable.

19. The time temperature monitoring system of claim 15, wherein the monitoring system periodically monitors the array of FETs to ascertain which FETs are operable and which FETS are inoperable, wherein time temperature information is generated based on which FETs are operable and which FETS are inoperable.

* * * * *